United States Patent
Kang

(10) Patent No.: US 8,247,854 B2
(45) Date of Patent: Aug. 21, 2012

(54) CMOS IMAGE SENSOR

(75) Inventor: Jin Yeong Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/899,473

(22) Filed: Oct. 6, 2010

(65) Prior Publication Data

US 2011/0084322 A1   Apr. 14, 2011

(30) Foreign Application Priority Data

Oct. 8, 2009 (KR) .......... 10-2009-0095776
Apr. 14, 2010 (KR) .......... 10-2010-0034426

(51) Int. Cl.
 *H01L 31/062* (2012.01)
(52) U.S. Cl. .............. 257/292; 257/E31.053
(58) Field of Classification Search ......... 257/291–292, 257/E31.053
See application file for complete search history.

(56) References Cited

U.S. PATENT DOCUMENTS

| | | | |
|---|---|---|---|
| 4,148,051 A * | 4/1979 | Koike et al. ............ | 257/292 |
| 6,242,728 B1 | 6/2001 | Merrill et al. | |
| 6,690,000 B1 | 2/2004 | Muramatsu et al. | |
| 6,974,943 B2 | 12/2005 | Manabe et al. | |
| 2004/0217426 A1 * | 11/2004 | Lee ............... | 257/369 |
| 2005/0062078 A1 * | 3/2005 | Han ............... | 257/233 |
| 2006/0124976 A1 * | 6/2006 | Adkisson et al. ........ | 257/292 |
| 2006/0192250 A1 * | 8/2006 | Lee ............... | 257/338 |
| 2007/0007562 A1 * | 1/2007 | Cha ............... | 257/292 |

FOREIGN PATENT DOCUMENTS

| | | |
|---|---|---|
| KR | 10-1995-0021804 A | 7/1995 |
| KR | 10-2003-0001113 A | 1/2003 |
| KR | 10-2003-0001116 A | 1/2003 |
| KR | 10-2006-0044088 A | 5/2005 |

OTHER PUBLICATIONS

Plummer, Silicon VLSI Technology, 2000, Prentice Hall, pp. 17-18.*
Masayuki Furumiya et al., "High-Sensitivity and No-Crosstalk Pixel Technology for Embedded CMOS Image Sensor", IEEE Transaction On Electron Devices, Oct. 2001, pp. 2221-2227, vol. 48, No. 10, IEEE.

* cited by examiner

*Primary Examiner* — Tucker Wright

(57) ABSTRACT

Disclosed is a CMOS image sensor and a manufacturing method thereof. According to an aspect of the present invention, each pixel of CMOS image sensor includes a photo detector that includes an electon Collection layer doped with a concentration of $5 \times 10^{15}/cm^3$ to $2 \times 10^{16}/cm^3$; and a transfer transistor that is connected to the photo detector and is formed of a vertical type trench gate of which the equivalent oxide thickness is 120 Å or more.

9 Claims, 20 Drawing Sheets

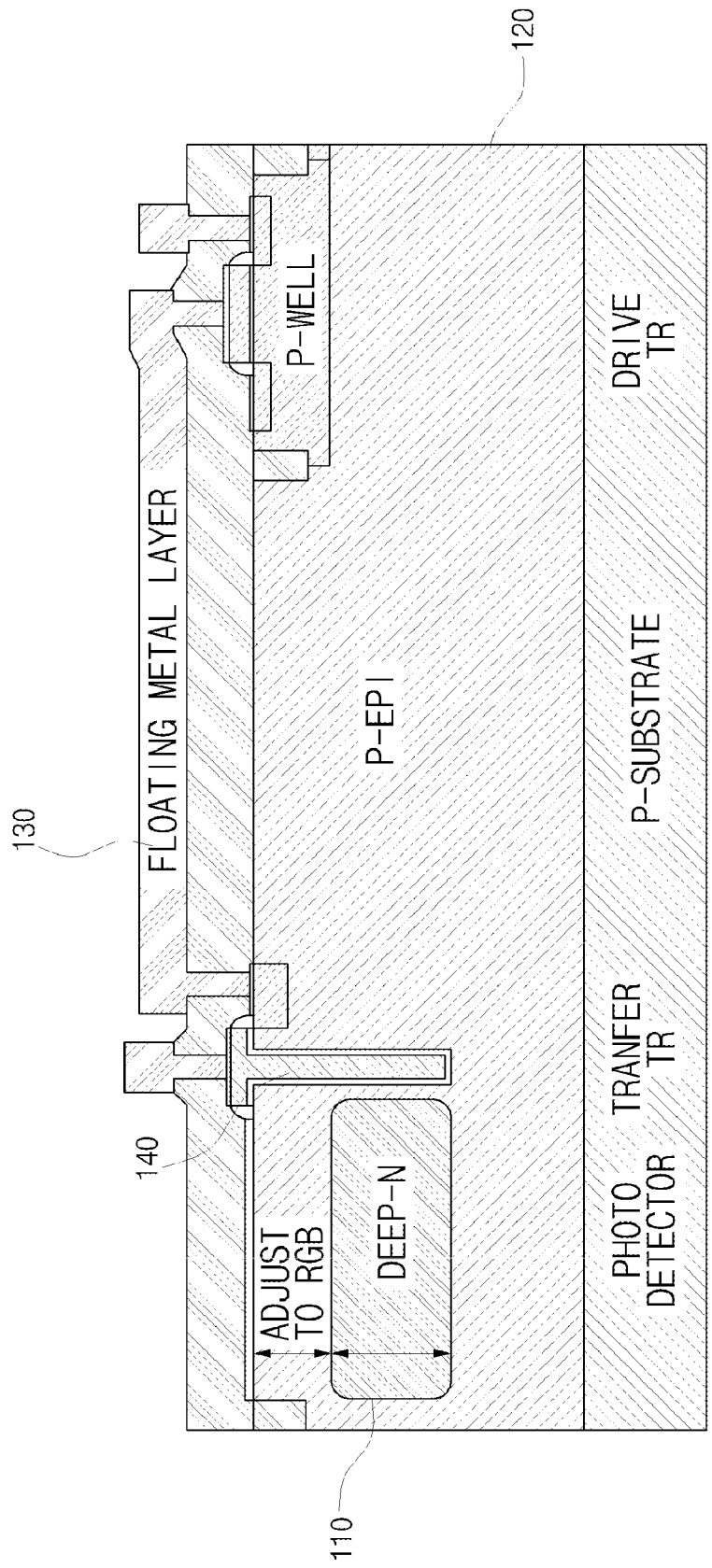

S420(FORM P TYPE EPITAXIAL LAYER)

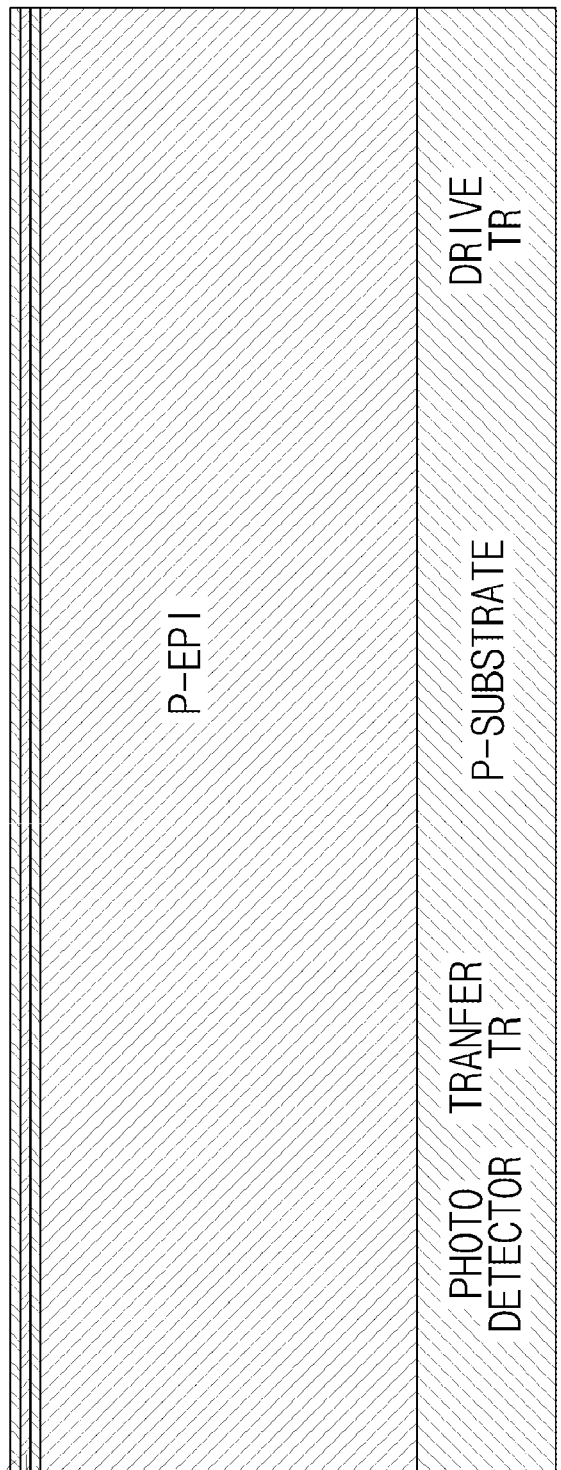

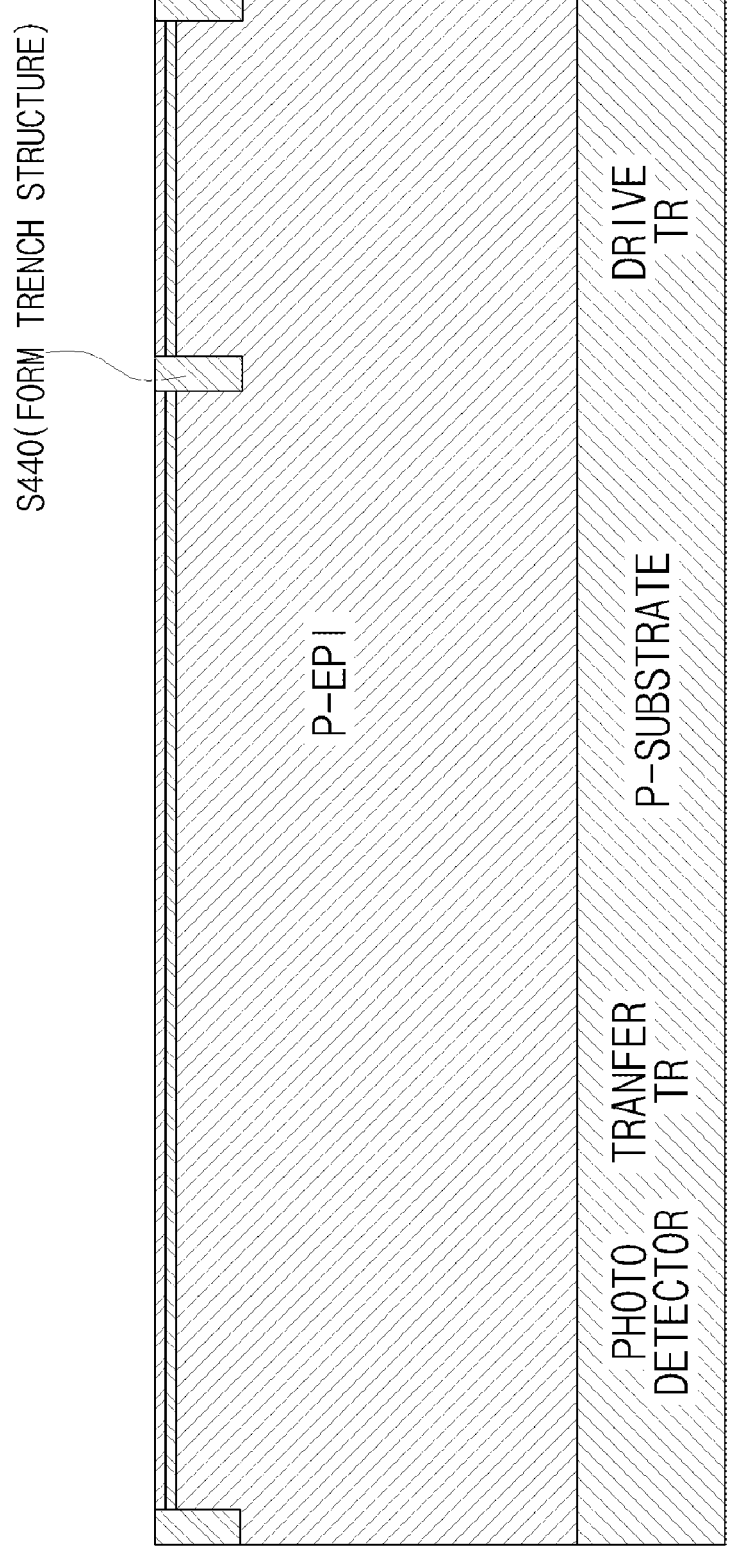

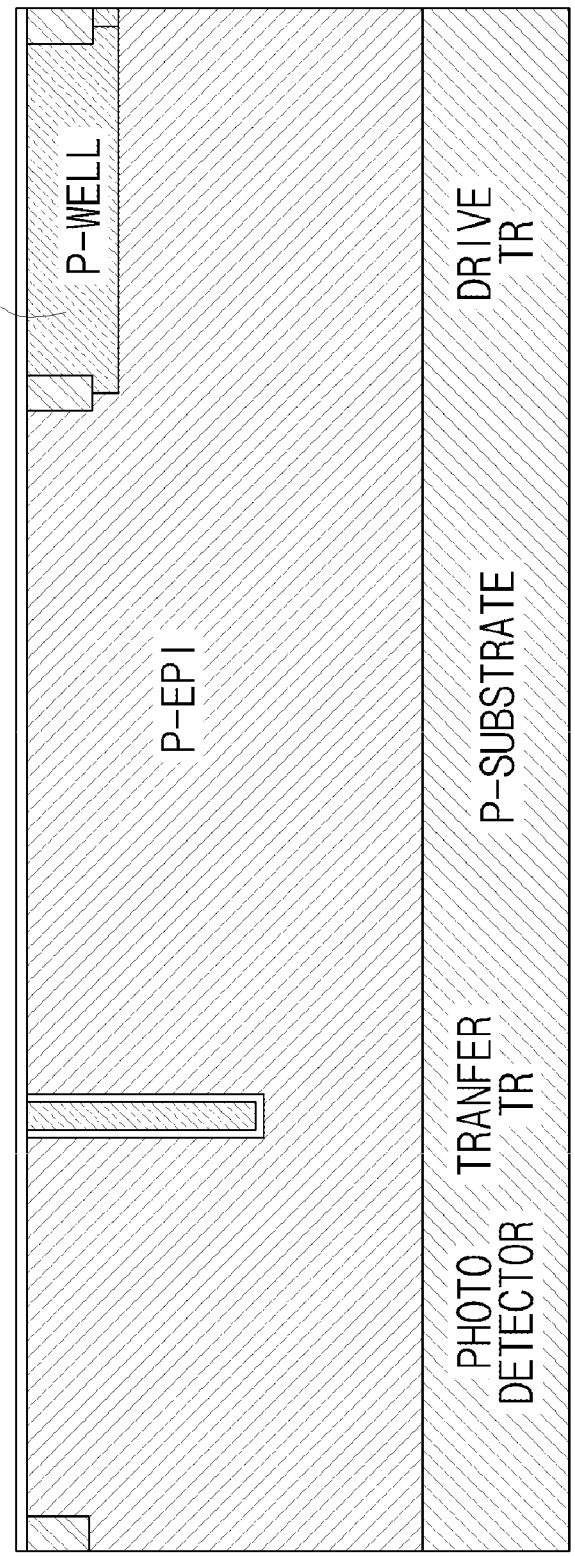

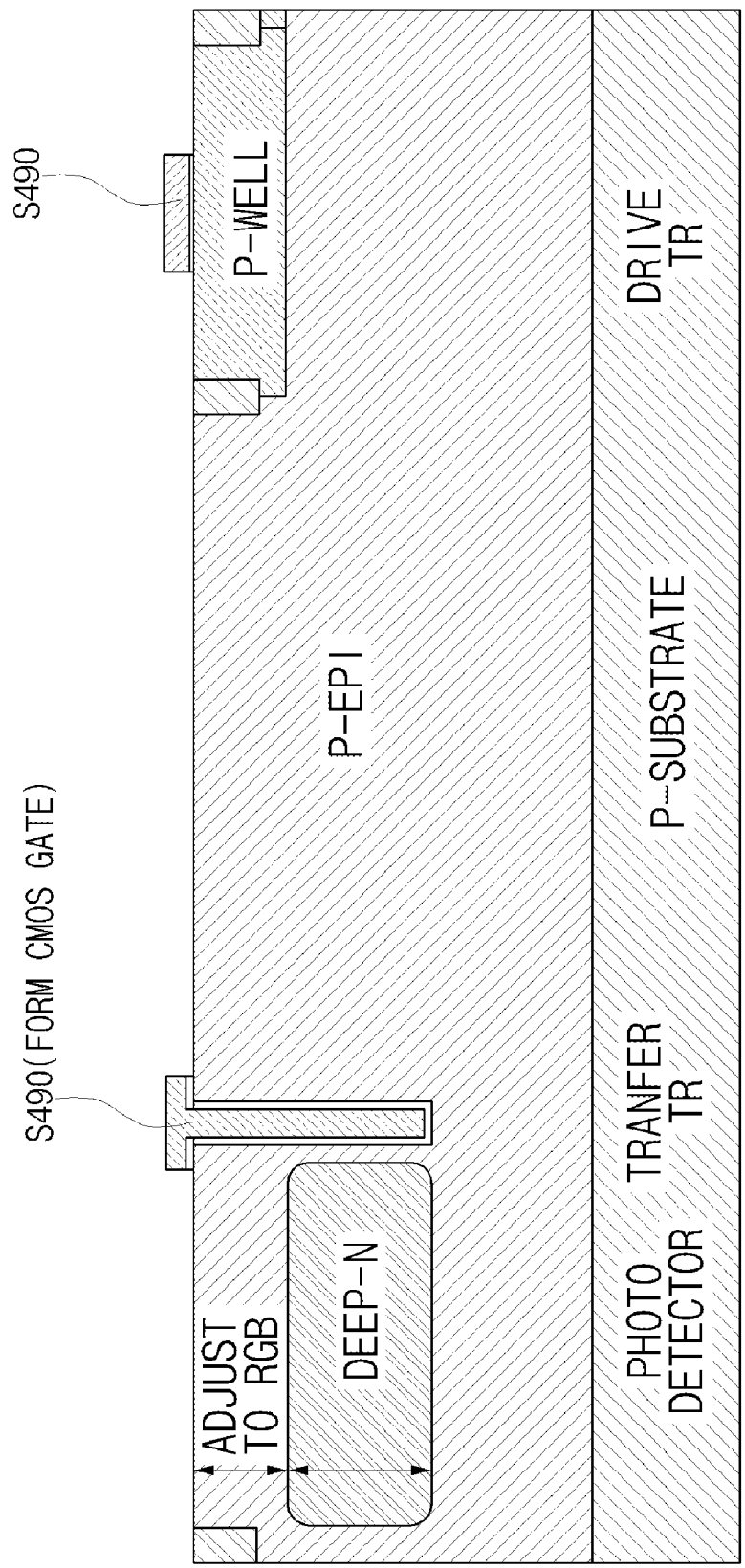

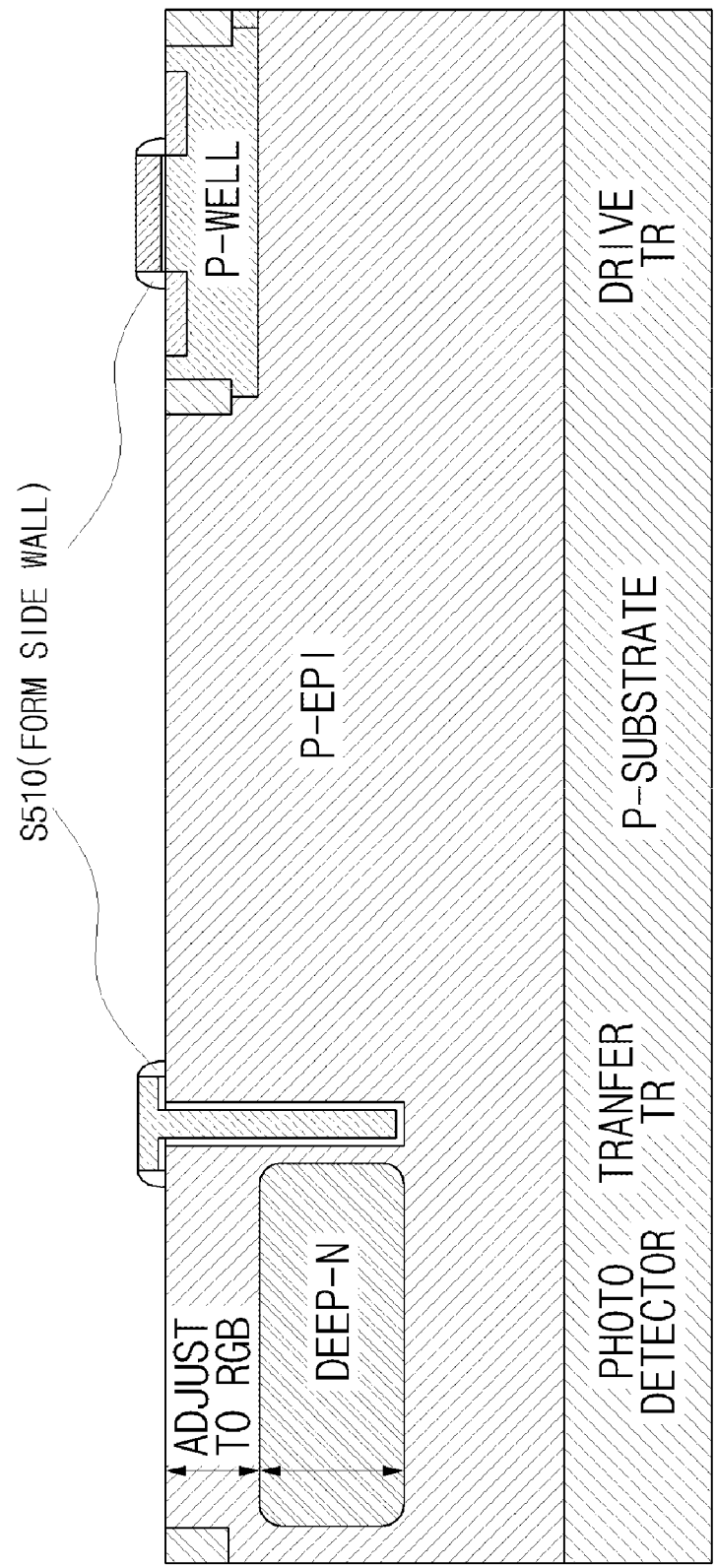

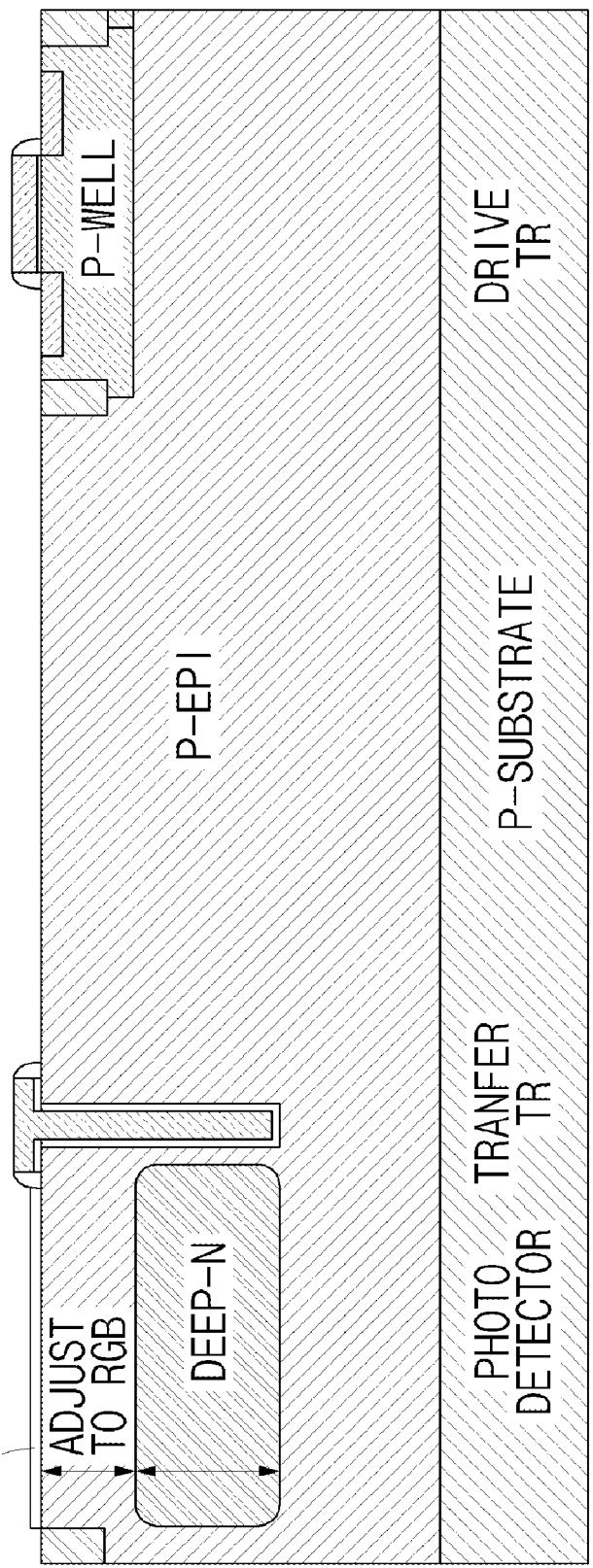

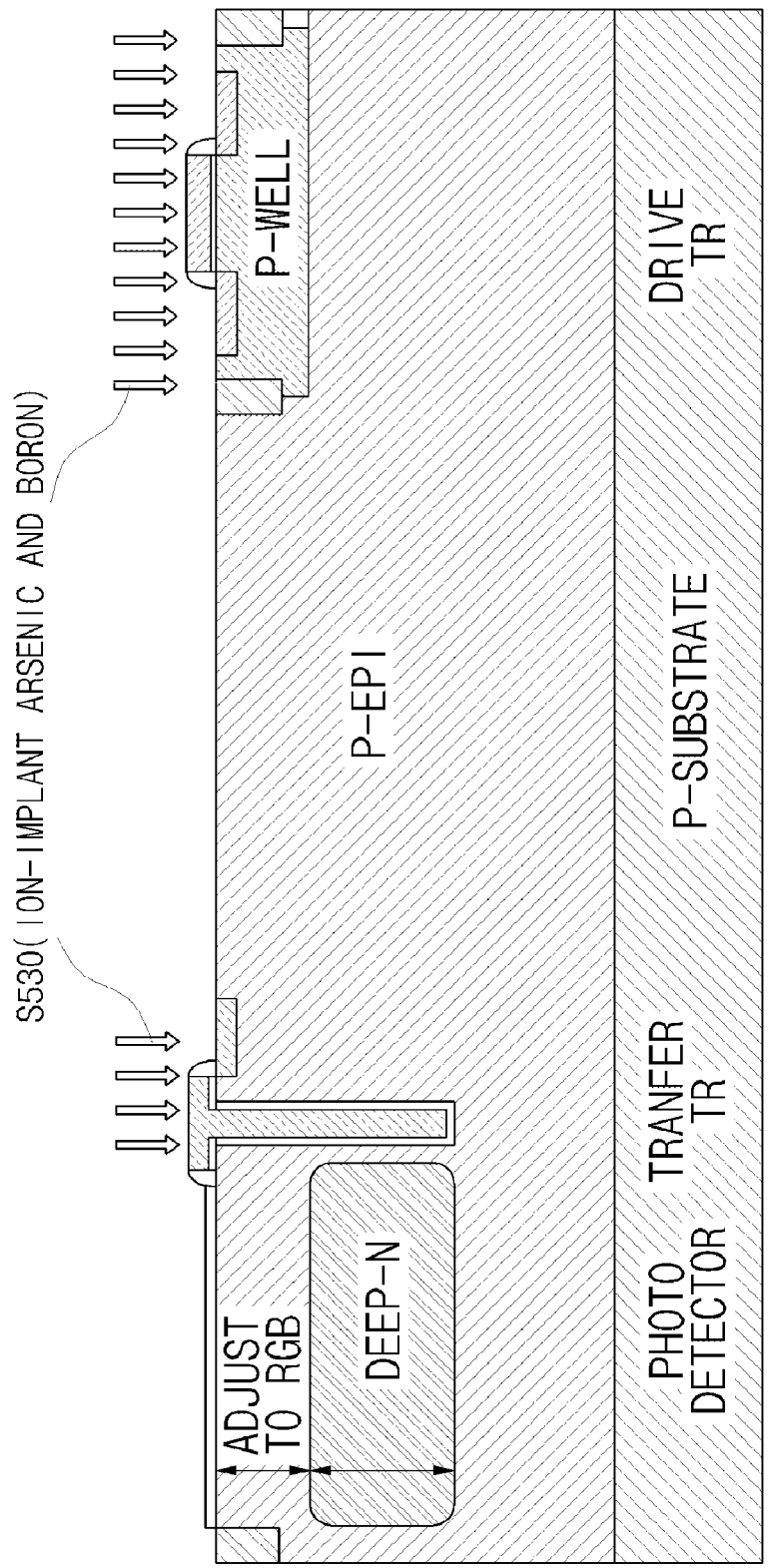

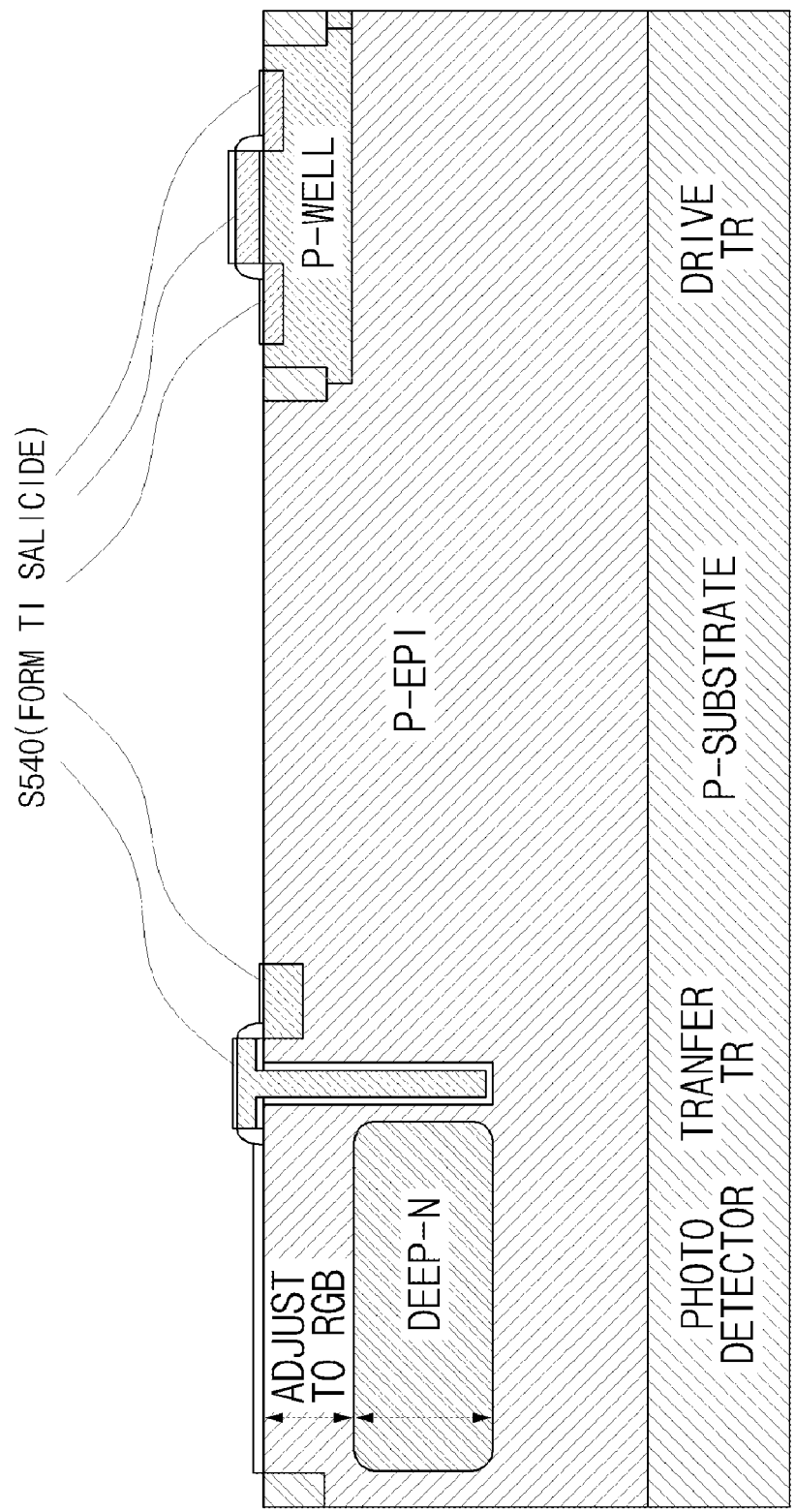

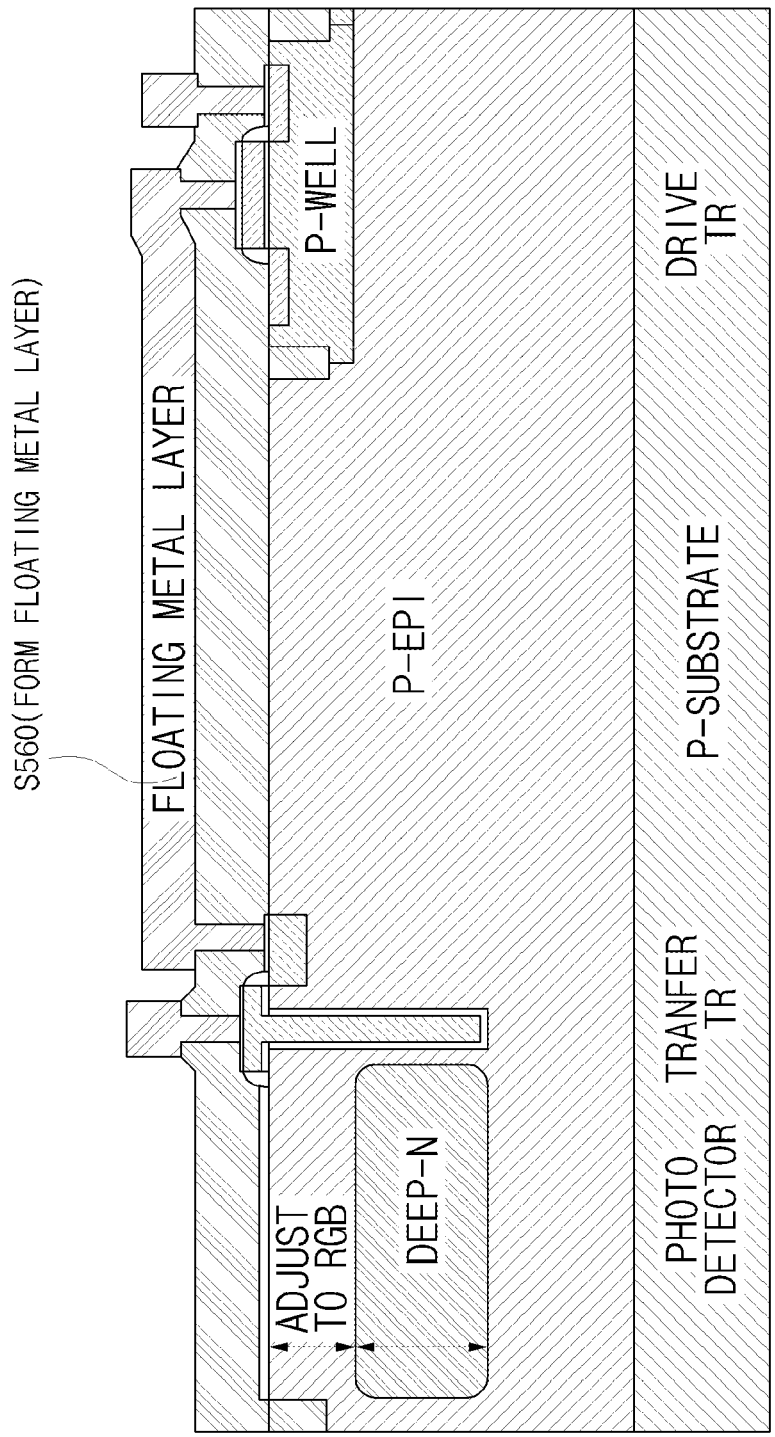

US 8,247,854 B2

CMOS IMAGE SENSOR

CROSS-REFERENCE TO RELATED APPLICATIONS

This application claims priority under 35 U.S.C. §119 to Korean Patent Application No. 10-2010-0034426, filed on Apr. 14, 2010, and Korean Patent Application No. 10-2009-0095776, filed on Oct. 8, 2009, in the Korean Intellectual Property Office, the disclosure of which is incorporated herein by reference in its entirety.

BACKGROUND OF THE INVENTION

1. Field of the Invention

The present invention relates to a CMOS image sensor, and more particularly, to a CMOS image sensor capable of improving low exposure and high exposure qualities of image and a manufacturing method thereof.

2. Description of the Related Art

Recently, CCD or CMOS type image sensors have been developed by companies, such as Omnivision, Micron, Foveon, Sony, Samsung Electrionics, Dongbu hightec, Magnachip, etc.

The former CCD type image sensor has been developed by a Long Electron Life Time technology, a Double poly technology, and a High Voltage semiconductor technology. The CCD image sensor can be manufactured using only three to four parts and provides excellent image quality. However, the CCD type image sensor requires driving powers of different levels 14 V, 3.3 V, −8 V and consumes power three times as much as the CMOS image sensor.

The latter CMOS image sensor has been mainly used for a cellular phone camera, a digital still camera, etc. Although CMOS image sensor has advantages, such as compact size, low power consumption, single chip, high integration, and high pixel, the low exposure sensitivity deteriorates with the increase of dense, which should be improved.

SUMMARY OF THE INVENTION

In order to solve the above problems, it is an object of the present invention to provide a CMOS image sensor capable of improving low exposure and high exposure quality of image by changing a cell structure and a doping concentration and a manufacturing method thereof.

According to an aspect of the present invention, there is provided a CMOS image sensor, each pixel of which including: a photo detector that includes an electron collection layer doped with a concentration of $5\times10^{15}/cm^3$ to $2\times10^{16}/cm^3$; and a pixel including a transfer transistor that includes is connected to the photo detector and is formed of a vertical type trench gate of which the equivalent oxide thickness is 120 Å or more.

According to another aspect of the present invention, there is provided a manufacturing method of a CMOS image sensor, including: forming an epitaxial layer on a semiconductor substrate; forming a trench gate having a vertical structure on the epitaxial layer; forming an electron collection layer that is spaced at a predetermined interval from the trench gate and is doped with $5\times10^{15}/cm^3$ to $2\times10^{16}/cm^3$ through ion implantation in the epitaxial layer; forming a transfer transistor and a drive transistor that have equivalent oxide thicknesses of gates of 120 Å or more; and forming a floating metal layer that connects the transfer transistor and the drive transistor by a metal wiring According to another aspect of the present invention, there is provided a manufacturing method of a CMOS image sensor, including: forming an epitaxial layer on a semiconductor substrate; forming a trench gate having a vertical structure on the epitaxial layer; forming an electron collection layer of a photo detector that is spaced at a predetermined interval from the trench gate through ion implantation in the epitaxial layer; forming a transfer transistor and a drive transistor that have equivalent oxide thicknesses of gates of 120 Å or more; and forming a diffusion layer that connects the transfer transistor and the drive transistor.

BRIEF DESCRIPTION OF THE DRAWINGS

FIG. 2 is a diagram showing a structure of each pixel of the CMOS image sensor according to an exemplary embodiment of the present invention;

DETAILED DESCRIPTION OF THE PREFERRED EMBODIMENTS

Advantages and features of the present invention and methods to achieve them will be elucidated from exemplary embodiments described below in detail with reference to the accompanying drawings. However, the present invention is not limited to exemplary embodiment disclosed herein but will be implemented in various forms. The exemplary embodiments are provided by way of example only so that a person of ordinary skill in the art can fully understand the disclosures of the present invention and the scope of the present invention. Therefore, the present invention will be defined only by the scope of the appended claims. Meanwhile, terms used in the present invention are to explain exemplary embodiments rather than limiting the present invention. In the specification, a singular type may also be used as a plural type unless stated specifically. "Comprises" and/or "comprising" used herein does not exclude the existence or addition of one or more other components, steps, operations and/or elements.

Figure 1:
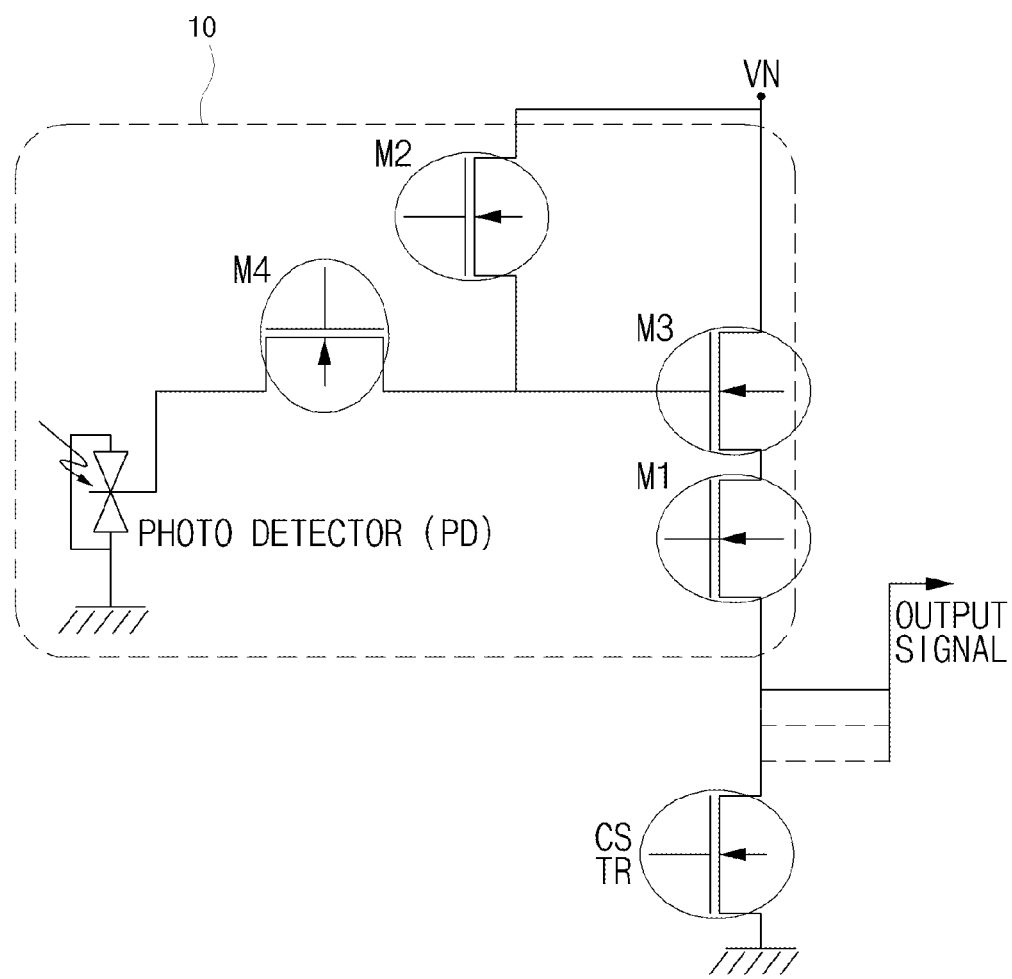
FIG. 1 is a diagram showing a circuit diagram of each pixel of a CMOS image sensor according to an exemplary embodiment of the present invention.

Hereinafter, a circuit of a CMOS image sensor according to exemplary embodiments of the present invention will be described with reference to FIG. 1. FIG. 1 is a diagram showing a circuit diagram of each pixel of a CMOS image sensor according to an exemplary embodiment of the present invention.

As shown in FIG. 1, each pixel includes a photo detector (PD) and four transistors M1, M2, M3, and M4.

The four transistors M1, M2, M3, and M4 is respectively a transfer transistor (Transfer TR) M4, a reset transistor (Reset TR) M2, a drive transistor (Drive TR) M3, and a select transistor (Select TR) M1.

Each pixel starts to drive by applying a select signal to the select transistor M1. Then, when a reset signal is applied to the reset transistor M2, the drive transistor M3 is driven according to the driving of the reset transistor M2 and the select transistor M1, such that each pixel outputs the reset signal.

Next, when the reset signal is no more applied to each pixel, the reset transistor M2 is not driven. Then, when the transfer transistor M4 is driven by applying the transfer signal to the transfer transistor M4, each pixel outputs image signals received from the photo detector (PD).

As described above, the present invention improves the structure of the photo detector (PD), the transfer transistor (M4), and the drive transistor (M3), thereby making it possible to improve the image quality at both the low exposure and the high exposure.

Hereinafter, a structure of each pixel of the CMOS image sensor according to the exemplary embodiments of the present invention will be described with reference to FIG. 2. FIG. 2 is a diagram showing a structure of each pixel of a CMOS image sensor according to an exemplary embodiment of the present invention.

As shown in FIG. 2, each pixel 10 of the CMOS image sensor according to the exemplary embodiments of the present invention includes the photo detector, the transfer transistor (Transfer TR), the drive transistor (Drive TR), the reset transistor (Reset TR), and the select transistor (Select TR), which has the following structure.

The photo detector can provide image signals having higher image quality as compared to the related art at the low exposure by changing the doping concentration and the vertical height of a Deep-N layer 110 that is an electron collection layer. In other words, the Deep-N layer 110 has the improved concentration and vertical height so that it can reach saturation exposure within 5 ms at 1000 Lux (low exposure) based on surface light incidence.

In detail, the Deep-N layer 110 of the photo detector is controlled to have different vertical height with respect to an RGB wavelength or an IR wavelength, thereby making it possible to increase the selectivity of light and to suppress the increase of unnecessary PD junction.

Further, the Deep-N layer 110 and an epitaxial layer 120 on the bottom of the photo detector are formed of, for example, the doping concentration of $1 \times 10^{16}/m^3$, thereby making it possible to realize voltage drop having a large head width even in weak light at the high initial voltage after the reset. At this time, it is preferable that the doping concentration of the epitaxial layer 120 is selected in $5 \times 10^{15}/cm^3$ to $2 \times 10^{16}/cm^3$.

The transfer transistor (Transfer TR) uses a trench structure having a vertical type structure and an equivalent oxide thickness of the gate is 120 Å or more, unlike the horizontal type structure in the related art.

In detail, the transfer transistor (Transfer TR) uses a vertical type trench gate 140 that is corresponds to the Deep-N layer 110 of which central height and depth is controlled at the RGB wavelength and has lower doping concentration in a side than in a surface. Thereby, the transfer transistor (Transfer TR) may easily transfer a small amount of electrons generated in the Deep-N layer 110 to a floating metal layer 130 as being sensed at the low exposure.

In addition, the trench gate 140 is disposed to be spaced by about 0.3 to 0.8 μm from the Deep-N layer 110 so that it is easy to transfer electrons to the floating metal layer 130. At this time, when the spaced distance is longer than the above value, electrons do not transfer to the floating metal layer 130 and on the other hand, when the spaced distance is shorter, noise can be increased at the time of transferring electrons. So, it is important to maintain an appropriate distance.

The transfer transistor (Transfer TR), the reset transistor (Reset TR), the drive transistor (Drive TR), and the select transistor (Select TR) controls the equivalent oxide thickness of the gate or the threshold voltage, thereby making it possible to prevent the deterioration of the signals at the saturation exposure. In detail, each transistor M1, M2, M3, and M4 may increase the gate applying voltage Vg to 5 V in resetting or sensing by forming the equivalent oxide thickness (EOT) of the gate at about 120 to 200 Å. Alternatively, each transistor M1, M2, M3, and M4 is configured to have low threshold voltage by about 0 to 0.2 V, thereby making it possible to prevent the deterioration of the signal at the saturation exposure.

Meanwhile, the CMOS image sensor 10 of the present invention lowers the capacitance of the floating-N layer connecting the transfer transistor (Transfer TR) and the drive transistor (Drive TV) in the following two manners. And the CMOS image sensor 10 transfers the voltage drop of the photo detector to the drive transistor (Drive TR) without a serious loss when being sensed, thereby making it possible to improve the receive sensitivity at the low exposure.

A first method configures the P-type well at a low concentration of $5 \times 10^{15}/cm^3$ to $2 \times 10^{16}/cm^3$ and this manner has a large effect at 180 nm or less.

A second method uses the floating metal layer using the metal wiring instead of the diffusion layer and can use the exiting CMOS process, thereby improving the process compatibility and can increase a low exposure receiving sensitivity as compared to the first manner. However, in order to sufficiently secure the current of the output signal, a fine tuning process for the gate minimum size may be needed. Herein, a bottom layer of the floating metal layer may be doped with the low concentration of $5 \times 10^{15}/cm^3$ to $2 \times 10^{16}/cm^3$.

The present invention may use both two manners but the second manner, that is, the case of using the floating metal layer 130 will be described in the following specification.

Figure 3A:
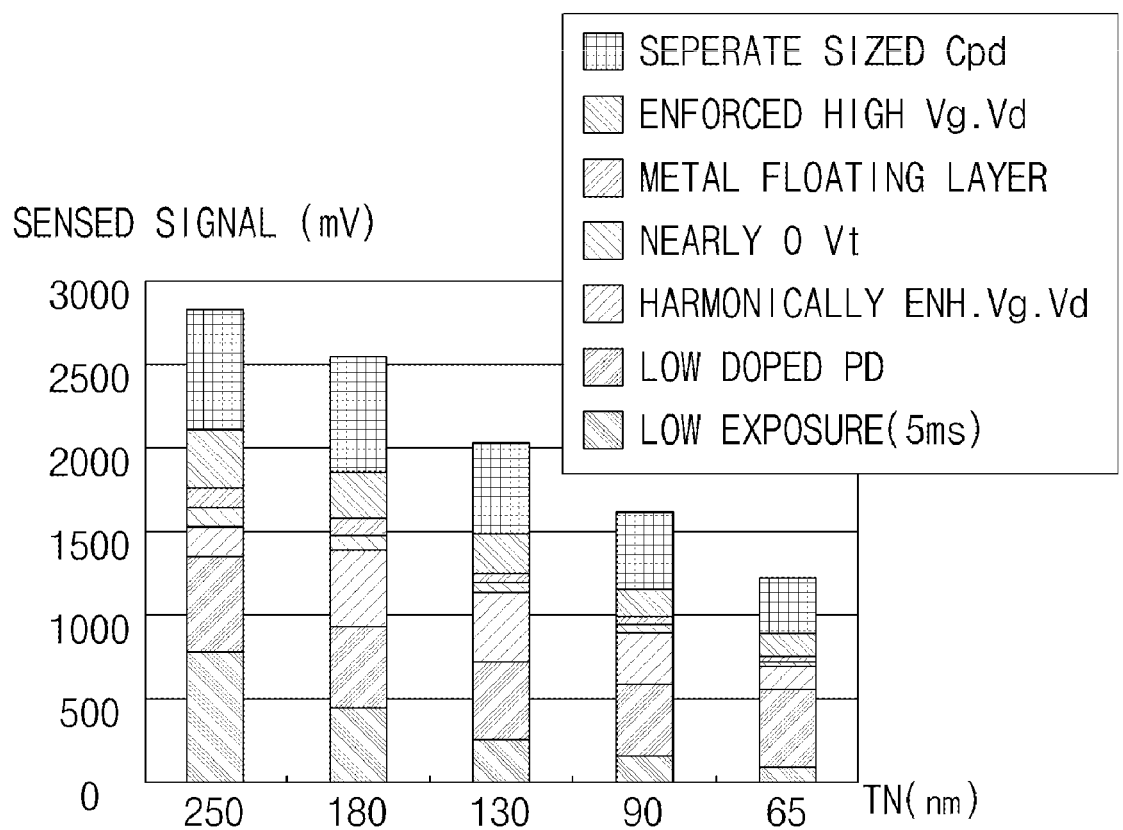
FIGS. 3A and 3B are graphs showing simulation results of the CMOS image sensor according to an exemplary embodiment of the present invention.
Figure 3B:
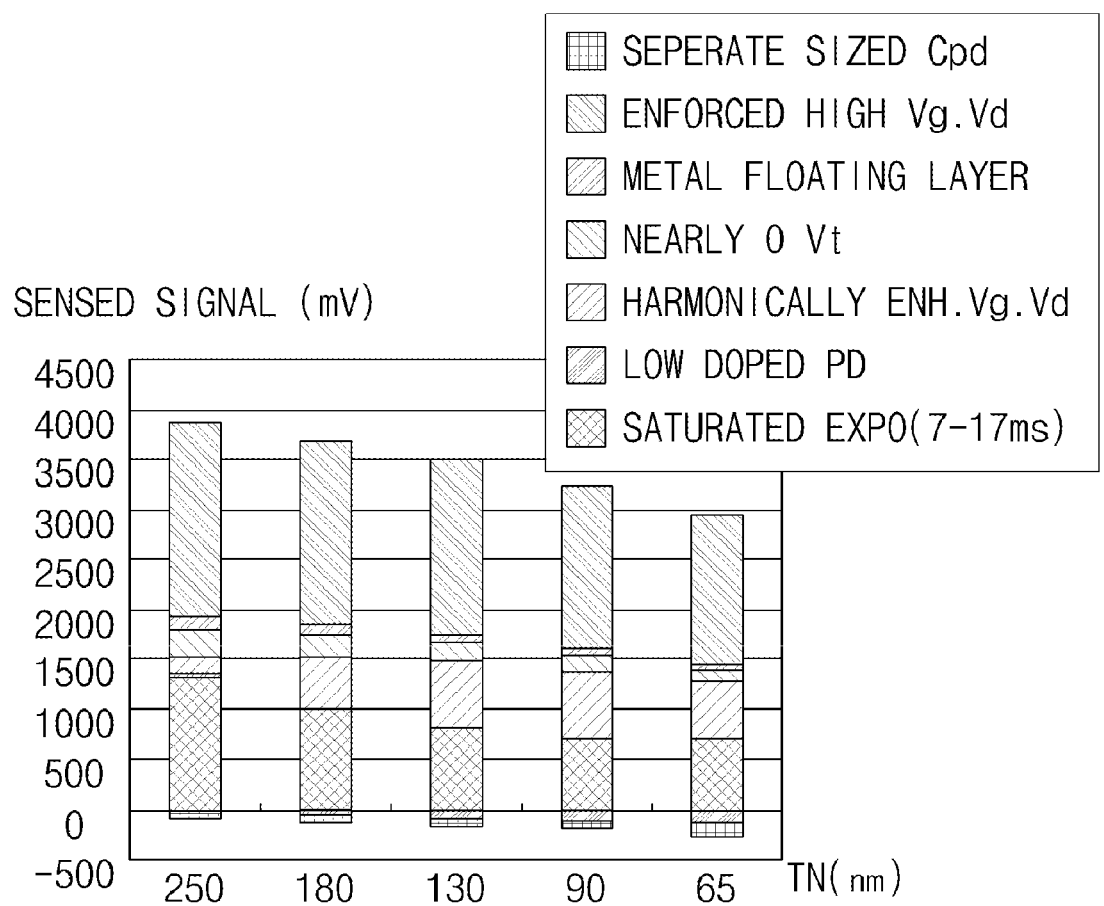

Hereinafter, the simulation results of the CMOS image sensor 10 according to the exemplary embodiment of the present invention will be described with reference to FIGS. 3A and 3B. FIGS. 3A and 3B show a graph of the simulation results of the CMOS image sensor 10 according to the exemplary embodiment of the present invention.

FIGS. 3A and 3B show a width mV of sensed signals in the case where technology node (TN) is 65 nm, 90 nm, 130 nm, 180 nm, and 250 nm. On the basis of solar light spectrum reaching the ground surface, the low exposure is the case that the sensor surface incidence light is 1000 Lux, the exposure time is 5 ms, and the saturation exposure is the case where the output signal is saturated to the maximum value. And each sensing is based on the output current of 10 uA.

Separate sized Cpd is the improved width of the sensing signal according to the control of the vertical depth of the Deep-N layer 110 with respect to the RGB wavelength and the IR wavelength.

Enforced High Vg and Vd are an improved width of the sensed signal by applying the operational voltage of the drain and the gate of each transistor M1, M2, M3, and M4 in the pixel as 5 V.

Metal floating layer is an improved width of the sensed signal according to replacing the diffusion layer with the metal wiring, that is, the floating metal layer 130.

Nearly 0 Vt is the improved width of the sensed signal by controlling the threshold voltage Vt of each transistor M1, M2, M3, and M4 in the pixel to about 0 V.

Harmonically Enh Vg, Vd are the improved width of the sensed signal when the Vg and Vd are increased in consideration of the CMOS technology road map. In order words, this can be considered as an effect obtained by increasing the equivalent oxide thickness of the gate of each transistor M1, M2, M3, and M4 to 150 to 200 Å.

Low doped PD is the improved width of the sensed signal according to configuring the Deep-N layer 110 and the lower bottom layer of the diffusion layer at a low concentration of about $5\times10^{15}/cm^3$ to $2\times10^{16}/cm^3$.

Low exposure is a width of a sensed signal when the incidence exposure of the sensor surface is 1000 Lux and the exposure time is 5 ms. The saturation exposure (Saturation Expo) is a width of the sensed signal when the saturation exposure, that is, 1000 Lux and the saturation exposure time is 7 ms to 17 ms. Herein, the low exposure and the saturation Expo correspond to the width of the sensed signal of the CMOS image sensor configured of the related art structure.

It can be appreciated from the simulation results of FIGS. 3A and 3B that the low exposure and high exposure image quality are enhanced by improving the Deep-N layer 110, the floating metal layer 130, and the gates of each transistor M1, M2, M3, and M4 like the CMOS image sensor of the present invention.

Figure 4A:
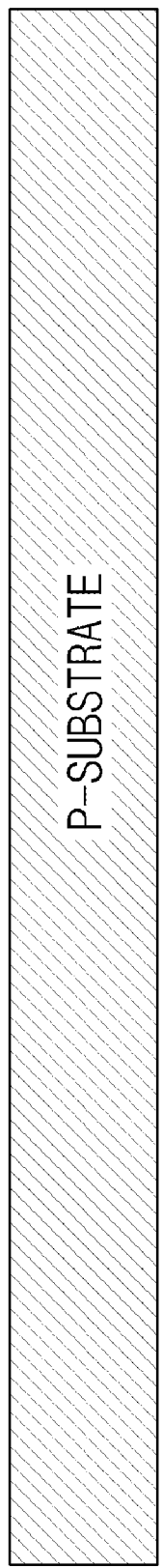
FIGS. 4A to 4P are diagrams showing each process of the CMOS image sensor according to an exemplary embodiment of the present invention.

Hereinafter, the process of manufacturing the CMOS image sensor according to the present invention will be described with reference to FIGS. 4A to 4P. FIGS. 4A to 4P are diagrams showing each process of the CMOS image sensor according to the exemplary embodiment of the present invention.

Through the process of FIG. 4A, a P type substrate is configured by doping a silicon (Si) wafer with boron to about 6 to 25 Ω·cm (S410).

Figure 4B:
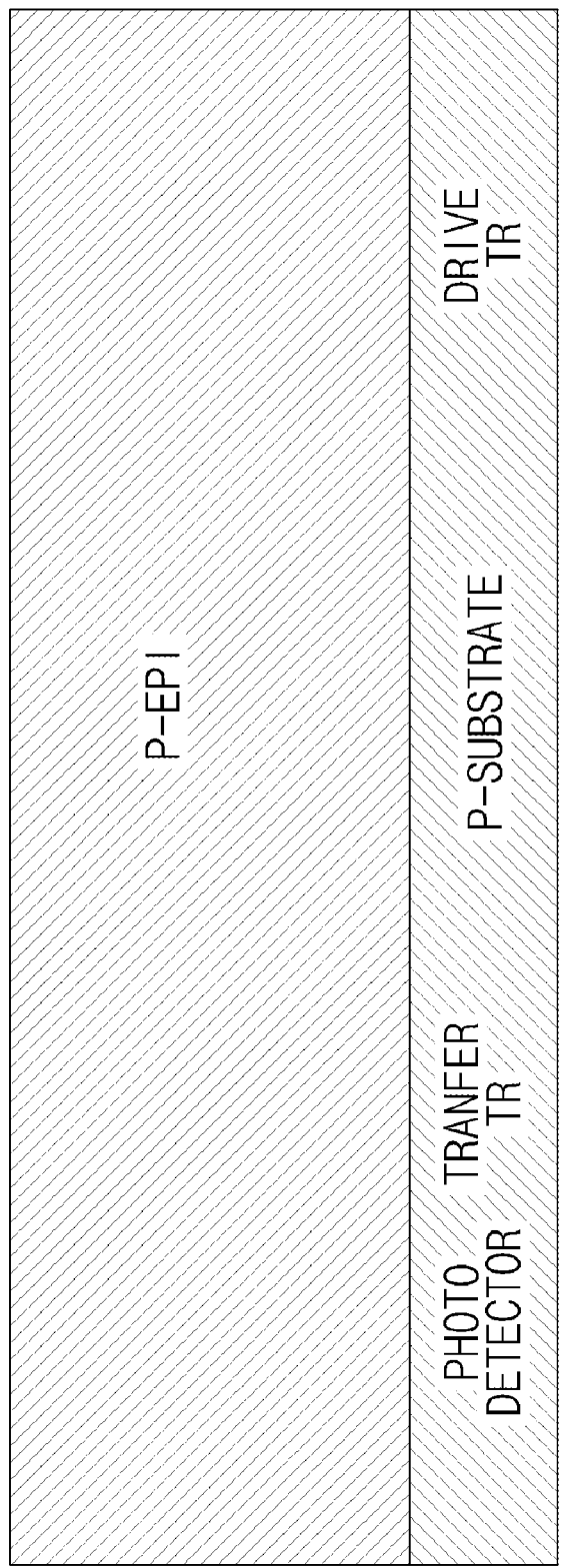

Through the process of FIG. 4B, a silicon epitaxial layer having the relatively small lattice defect and the high uniformity of the doping concentration is grown on the P type substrate (S420). Herein, the process of FIG. 4B is to a process for manufacturing the uniform image sensor.

At this time, the silicon epitaxial layer is a P type, its thickness is 5 to 10 μm, and is configured to be doped with boron to 1 to 3 Ω·cm.

Through the process of FIG. 4C, the pad oxide (Pad SiO2) is grown on the wafer formed on the P type epitaxial layer (S431) and the silicon nitride film (Si3N4) is formed on the pad oxide (S432), and a masking oxide is applied on the silicon nitride film (S433).

At this time, the silicon nitride film is to facilitate the stop control at the time of chemical mechanical polishing (CMP). And the masking oxide is to facilitate the patterning of the silicon nitride film (Si3N4).

The trench structure is formed through the process of FIG. 4d (S440).

Specifically, after the silicon nitride film is patterned, the trench area is etched and after the inner wall is thermally oxidized, the inside of the trench is filled by applying the oxide film. The oxide film of the area other than the trench area is planarized by performing the chemical mechanical polishing (CMP) using the etch stop characteristics of the silicon nitride film and treats by heating to increase the density, thereby completing the trench structure for isolating elements.

Figure 4E:
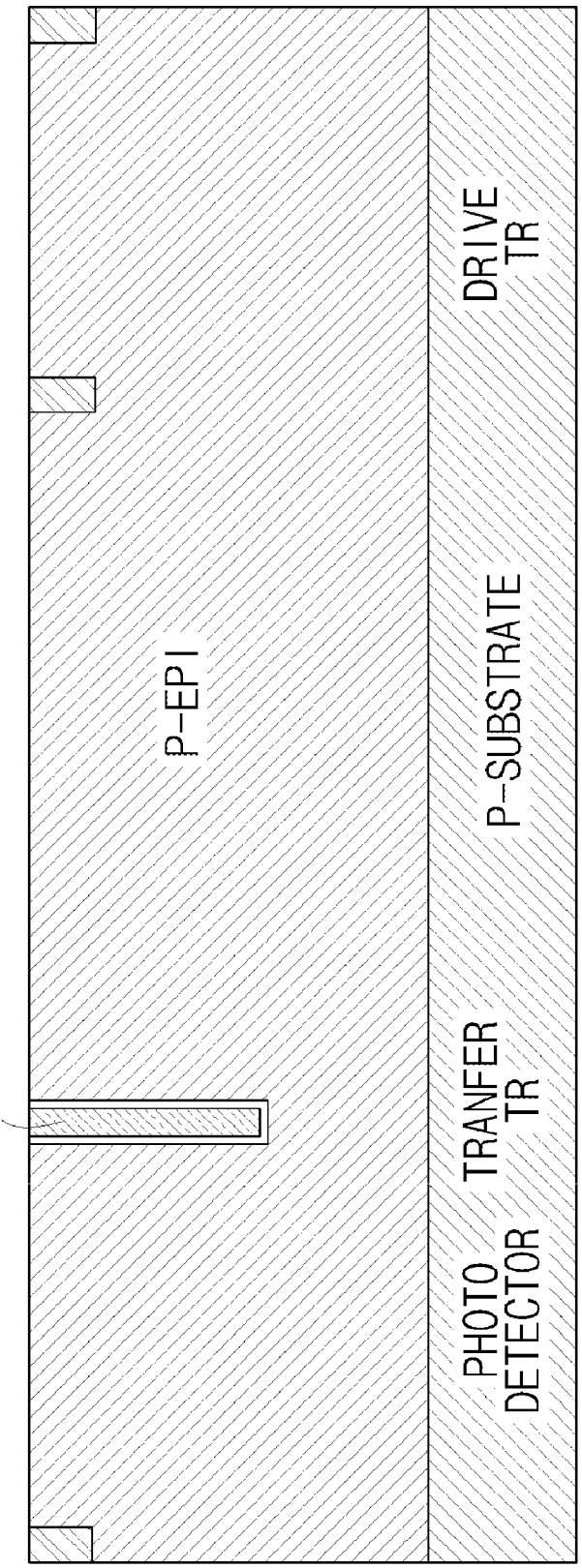

A trench transfer gate is formed through the process of FIG. 4E (S450).

Specifically, after the masking oxide is again applied to facilitate the silicon nitride film patterning and the trench transfer gate area is patterned on the silicon nitride film, the trench area is etched at a depth of 3 to 5 μm and the inner wall is thermally oxidized. Thereafter, the high temperature oxynitride is applied to about 120 to 200 Å at a high temperature of 930° C. to form the trench gate oxide on the inner wall of the trench.

Then, the inside of the trench gate is applied with poly-Si doped with high concentration n-type by a low pressure vapor deposition (LPCVD) method. The poly-Si and the oxide is planarized by the chemical mechanical polishing (CMP) using the etch stop characteristics of the silicon nitride film. And the remaining silicon nitride film is removed by a wet process, thereby completing the trench transfer gate.

An active layer of an element is formed on the epitaxial layer through the process of FIG. 4F (S460).

In detail, the surface of the epitaxial layer is thermally oxidized to form a protective film and a well layer is formed through the ion implantation. Then, boron is ion-implanted into the NMOS area of the formed well layer and phosphorus P is injected into the PMOS area. Thereafter, the active layer of the element is completed at a depth of 1 to 3 μm through the thermal diffusion.

Figure 4G:
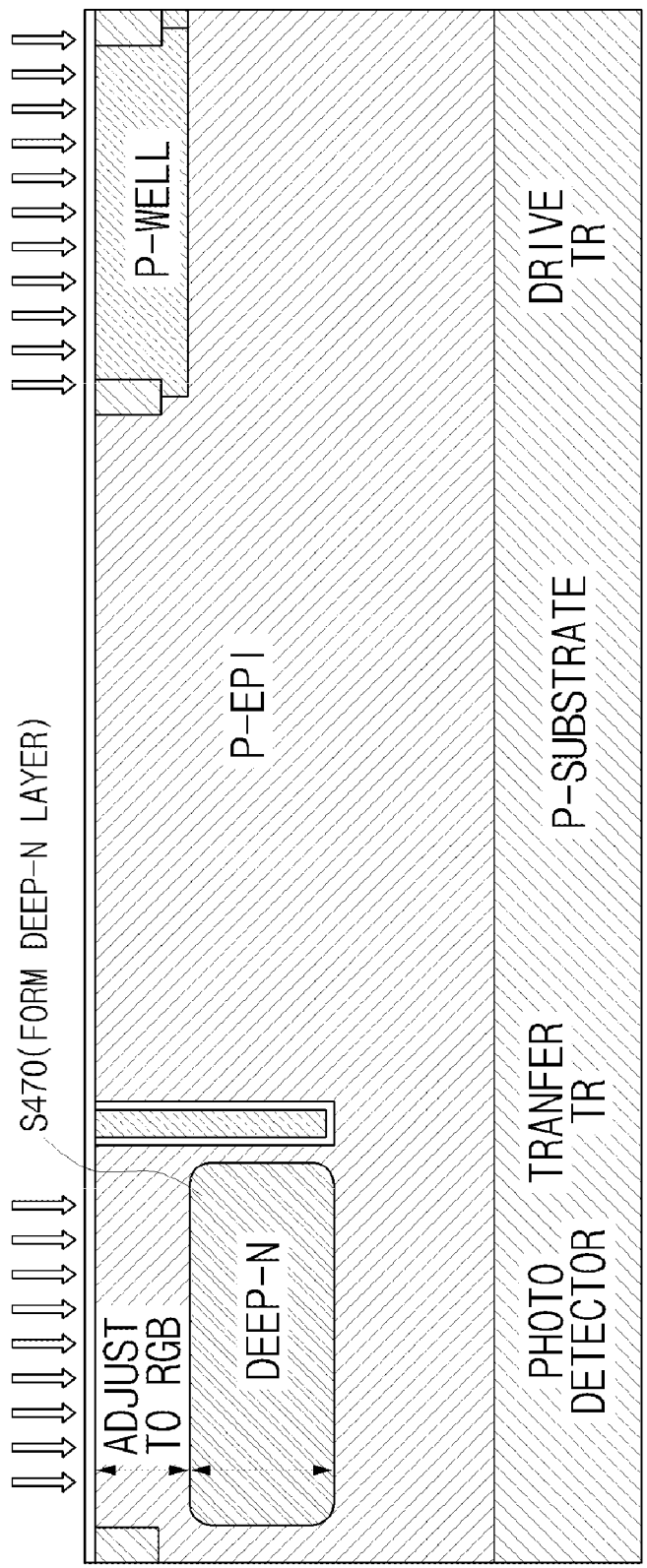

The Deep-N layer that is the central portion of the photo detector is formed through the process of FIG. 4G (S470).

Specifically, phosphorus is ion-implanted into the epitaxial layer of the photo detector to form the Deep-N layer and a predetermined amount of boron and phosphorus (p) is ion-implanted in each well area and then, thermally treated in order to appropriately control the threshold voltage Vt of the NMOS and the PMOS.

At this time, the vertical depth of the N-deep layer is 0.5 to 0.8 μm with respect to a Blue wavelength, 0.8 to 1.3 μm with respect to a green wavelength, 1.3 to 2.5 μm with respect to a red wavelength, and 2.5 to 5 μm with respect to an infrared (IR) wavelength.

Figure 4H:
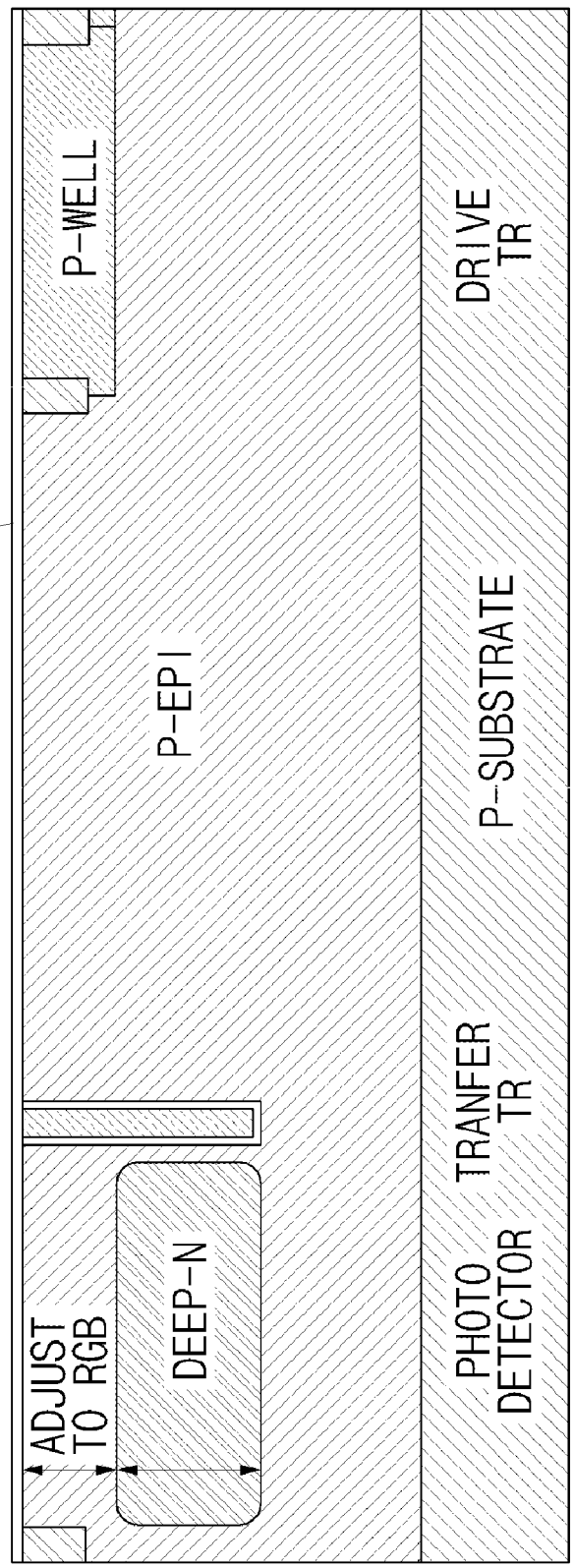

Through the process of FIG. 4H, the pad oxide is removed and the surface is cleaned and then, the gate oxide is grown at a thickness of 120 to 200 Å (S480).

Through the process of FIG. 4I, the poly-Si for the gate is applied on the oxide and the poly-Si for the gate is patterned, thereby forming the CMOS gate. The doping of the source/drain area is prepared by removing the gate oxide remaining at the lower layer of the area other than the formed CMOS gate (S490).

Figure 4J:
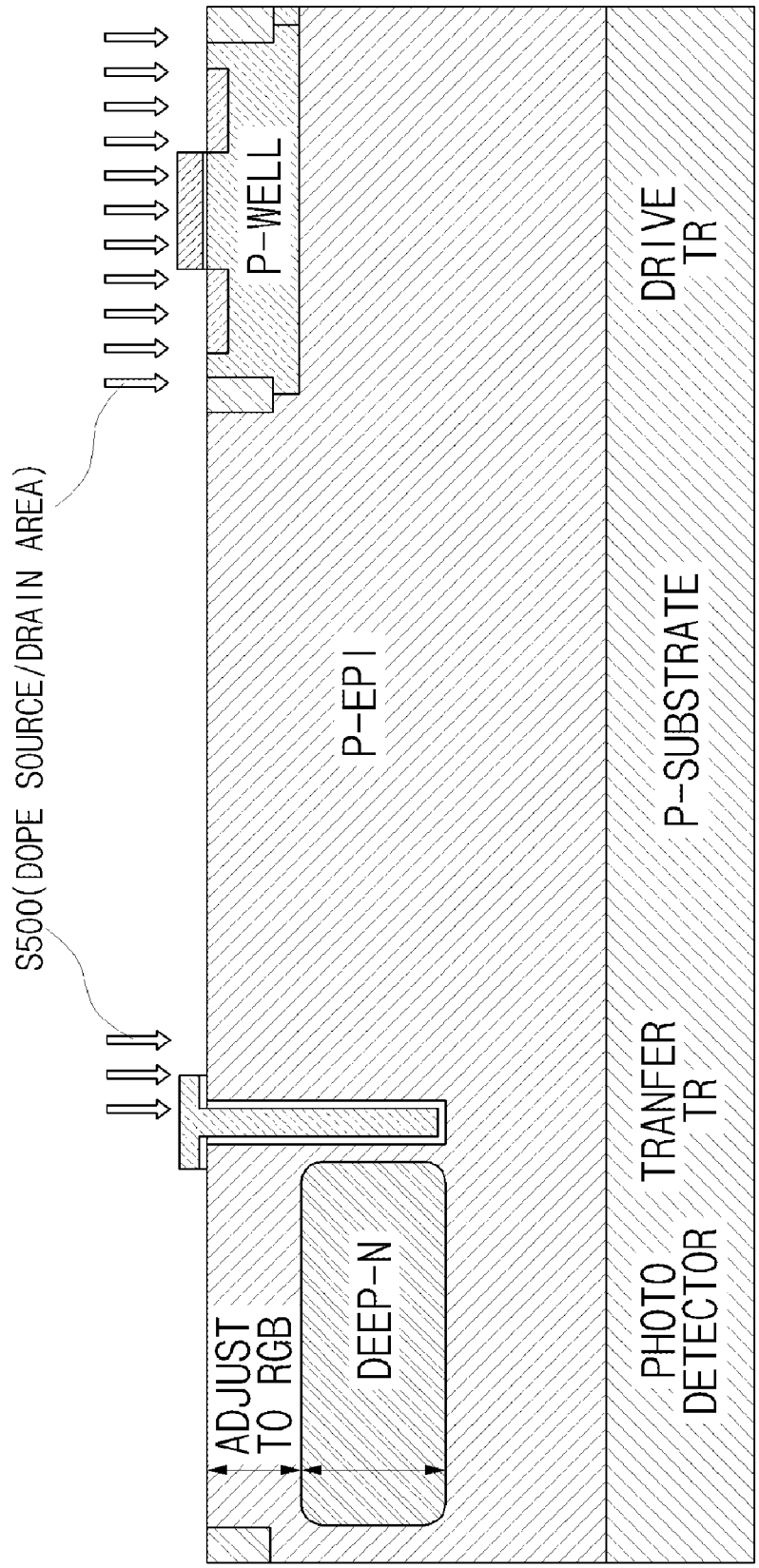
Figure 40:
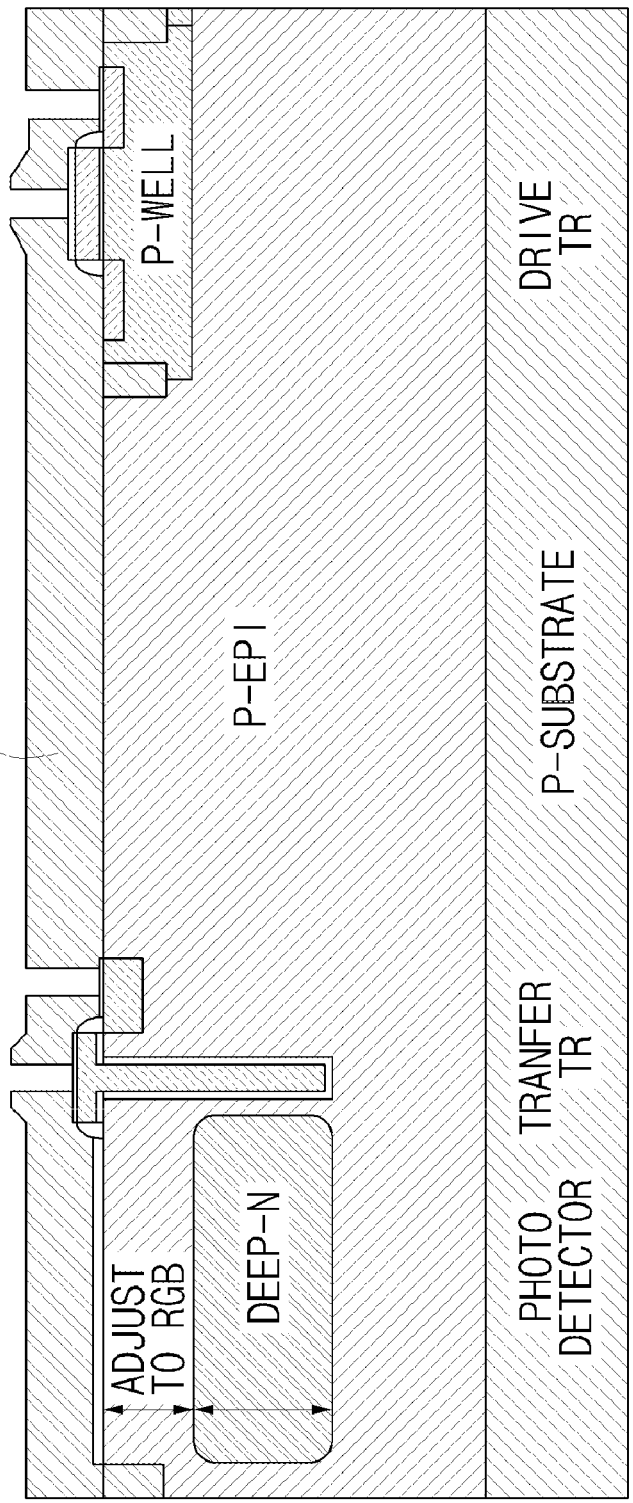

Through the process of FIG. 4J, a lightly doped drain (LDD) is ion-implanted in the source/drain area (S500). This is to increase the breakdown voltage of the drain and reduce hot carriers.

Through the process of FIG. 4K, the oxide SiGe or the oxynitride film SiON are applied and are etched in a vertical direction, thereby forming the side wall (S510). This is to increase the insulation between gate and the source/drain and the metal terminal.

Through the process of FIG. 4L, the thin film epitaxial layer or the thin film poly layer of the oxide SiGe or SiGeC are formed on the upper layer of the photo detector (S520).

At this time, the formed thin film is a film doped with boron at high concentration of about $5\times10^{18}/cm^3$ to $2\times10^{19}/cm^3$ during a growth process and its thickness is very thin at 150 to 200 Å. However, the formed thin film remains only on the photo detector through the patterning, thereby making it possible to reduce the dark noise by preventing electrons from injecting into the surface of the photo detector at the time of the operation.

Through the process of FIG. 4M, arsenic As and boron are ion-implanted in the source/drain areas of the NMOS and the PMOS to be doped with high concentration, thereby forming the source/drain of the NMOS and the PMOS (S530).

Through the process of FIG. 4N, the resistance of the gate/source/drain areas are lowered (S540).

Specifically, Ti/TiN is deposited in the gate/source/drain areas, thermally treated with a primary low-temperature rapid thermal processing (RTP) apparatus, and then, wet-etched. Ti silicide (TiSi2) is selectively performed only on the area where silicon Si is exposed by performing the secondary high-temperature thermal processing, thereby lowering the resistance of the gate/source/drain areas.

Through the process of FIG. 4O, the inter-layer insulating oxide is applied thereby forming the contact open between the semiconductor and the metal wiring layer (S550).

Through the process of the FIG. 4P, the floating metal layer is formed by depositing Al/Ti/TiN layers and patterning the metal wiring (S560), thereby completing the CMOS image sensor.

According to the exemplary embodiment of the present invention, it can provide sensitivity of a CCD image sensor level at low exposure and high exposure by changing a cell structure of a CMOS image sensor, thereby making it possible to improve image quality.

In addition, the present invention can achieve the single chip, the low power consumption, and the packaging and can progressively improve the image sensor for portable devices by combining the advantages of the CMOS having low power consumption with the advantages of the CCD having excellent image quality.

While certain embodiments have been described above, it will be understood to those skilled in the art that the embodiments described can be modified into various forms without changing the technical spirit or essential features. Accordingly, the embodiments described herein are provided by way of example only and should not be construed as being limited. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A CMOS image sensor, each pixel of which comprises:
    a photo detector that includes an electron collection layer doped with a concentration of $5\times10^{15}/cm^3$ to $2\times10^{16}/cm^3$; and
    a transfer transistor that is connected to the photo detector and is formed of a vertical type trench gate comprising a gate insulator with an equivalent oxide thickness of 120 Å or more,
    wherein the trench gate is disposed to be spaced by 0.3 to 0.8 μm from the electron collection layer and has a depth of 3 to 5 μm.

2. The CMOS image sensor according to claim 1, wherein a vertical depth of the photo detector is controlled according to one of a plurality of light sensing wavelengths.

3. The CMOS image sensor according to claim 2, wherein the vertical depth is 0.5 to 0.8 μm when the light sensing wavelength is a blue wavelength, 0.8 to 1.3 μm when the light sensing wavelength is a green wavelength, 1.3 to 2.5 μm when the light sensing wavelength is a red wavelength, and 2.5 to 5 μm when the light sensing wavelength is an infrared (IR) wavelength.

4. The CMOS image sensor according to claim 1, wherein the photo detector further includes an epitaxial layer that is positioned under the electron collection layer and has a doping concentration of $5\times10^{15}/cm^3$ to $2\times10^{16}/cm^3$.

5. The CMOS image sensor according to claim 1, wherein the pixel further includes:
    a select transistor that is driven according to a select signal for the photo detector;
    a reset transistor that is driven according to a reset signal transmitted after the select signal; and
    a drive transistor that outputs an electric signal sensed by the photo detector according to a driving signal transmitted after the reset signal,
    wherein gates of the select transistor, the reset transistor, and the drive transistor have gate dielectric with an equivalent oxide thickness of 120 Å or more.

6. The CMOS image sensor according to claim 5, wherein at least one of the transfer transistor, the select transistor, the reset transistor, and the drive transistor has a threshold voltage of 0 to 0.2 V.

7. The CMOS image sensor according to claim 5, wherein the transfer transistor and the drive transistor are connected to each other by a floating layer formed of a metal layer.

8. The CMOS image sensor according to claim 1, wherein the photo detector further includes an upper surface layer that is formed of a thin film epitaxial layer or a thin film poly layer made of SiGe or SiGeC of 150 to 200 Å thickness.

9. The CMOS image sensor according to claim 8, wherein the upper surface layer is doped with a boron concentration of $5\times10^{18}/cm^3$ to $2\times10^{19}/cm^3$.

* * * * *